(12) United States Patent
Ho et al.

(10) Patent No.: US 12,538,817 B2
(45) Date of Patent: *Jan. 27, 2026

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Cheng-Lin Ho, Kaohsiung (TW); Chih-Cheng Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 105 days.

This patent is subject to a terminal disclaimer.

(21) Appl. No.: 16/907,059

(22) Filed: Jun. 19, 2020

(65) Prior Publication Data
US 2021/0398904 A1    Dec. 23, 2021

(51) Int. Cl.
*H01L 23/538* (2006.01)
*H01L 21/768* (2006.01)
*H01L 23/00* (2006.01)
*H01L 23/66* (2006.01)
*H01Q 1/22* (2006.01)

(52) U.S. Cl.
CPC .... *H01L 23/5386* (2013.01); *H01L 21/76838* (2013.01); *H01L 23/66* (2013.01); *H01L 24/14* (2013.01); *H01Q 1/2283* (2013.01)

(58) Field of Classification Search
CPC ..... H01L 23/5386; H01L 23/66; H01L 24/14; H01L 21/6838
See application file for complete search history.

(56) References Cited

U.S. PATENT DOCUMENTS

| | | | |
|---|---|---|---|
| 10,157,834 B1* | 12/2018 | Tang | H01L 23/53228 |
| 10,964,652 B2* | 3/2021 | Chen | H01L 23/66 |
| 11,721,652 B2* | 8/2023 | Lu | H01Q 21/205 |
| | | | 257/428 |
| 2002/0149086 A1* | 10/2002 | Aoki | H01L 23/5222 |
| | | | 257/532 |
| 2018/0255155 A1 | 9/2018 | Christopher et al. | |
| 2019/0198973 A1* | 6/2019 | Chen | H01L 23/53257 |
| 2021/0391295 A1* | 12/2021 | Karhade | H01L 24/16 |

* cited by examiner

*Primary Examiner* — Nathan W Ha
(74) *Attorney, Agent, or Firm* — FOLEY & LARDNER LLP

(57) ABSTRACT

A semiconductor device package includes a substrate, and interconnection structure and a package body. The interconnection structure is disposed on the substrate. The interconnection structure has a conductive structure and a first dielectric layer covering a portion of the conductive structure. The conductive structure defines an antenna feeding point. The package body is disposed on the substrate and covers the interconnection structure.

16 Claims, 18 Drawing Sheets

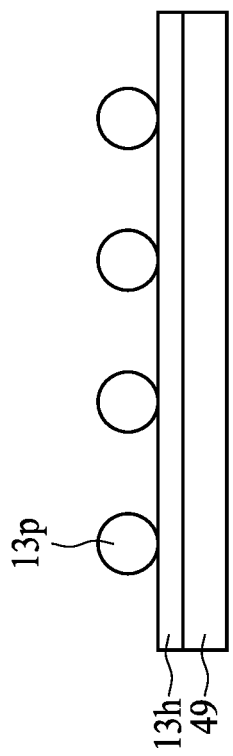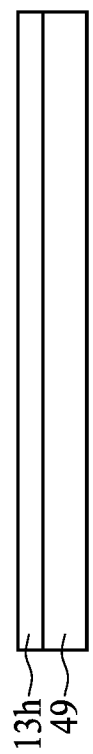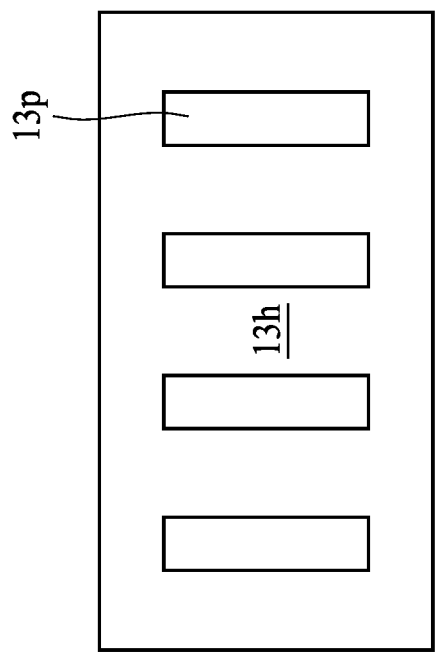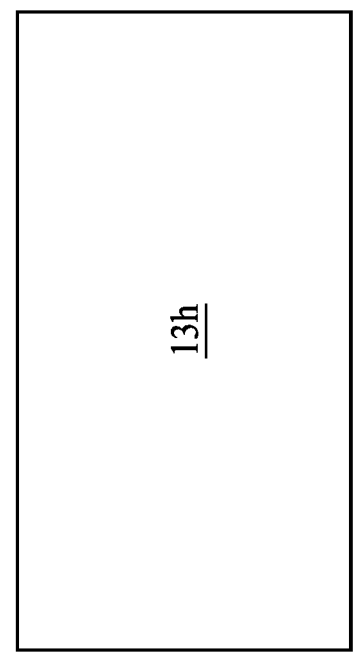
FIG. 4B
FIG. 4B'
FIG. 4A
FIG. 4A'

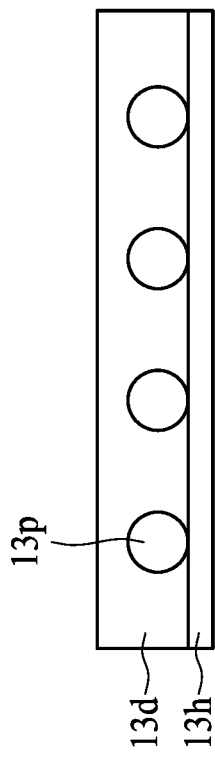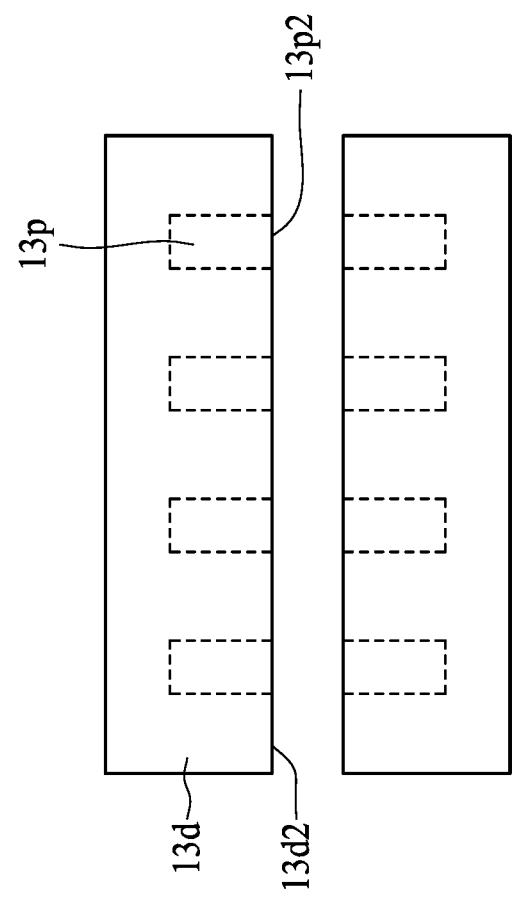

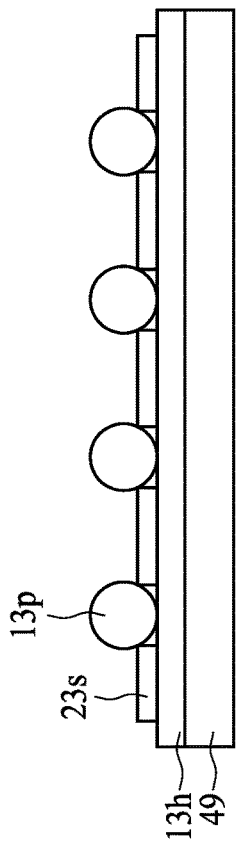
FIG. 5A
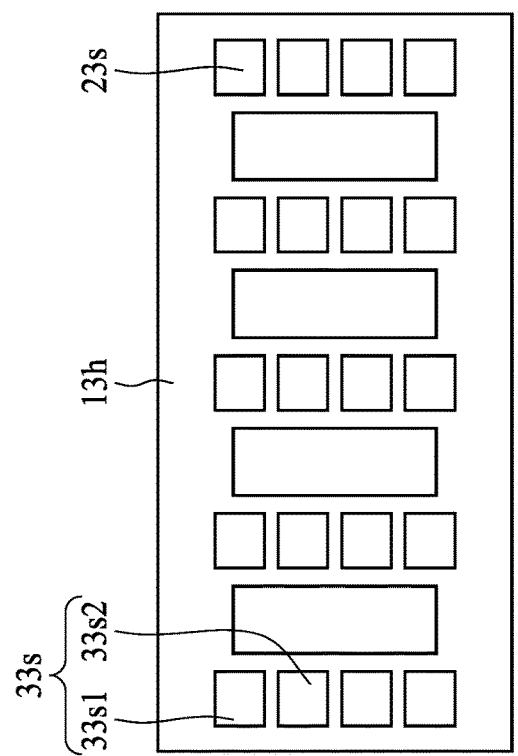
FIG. 5A"
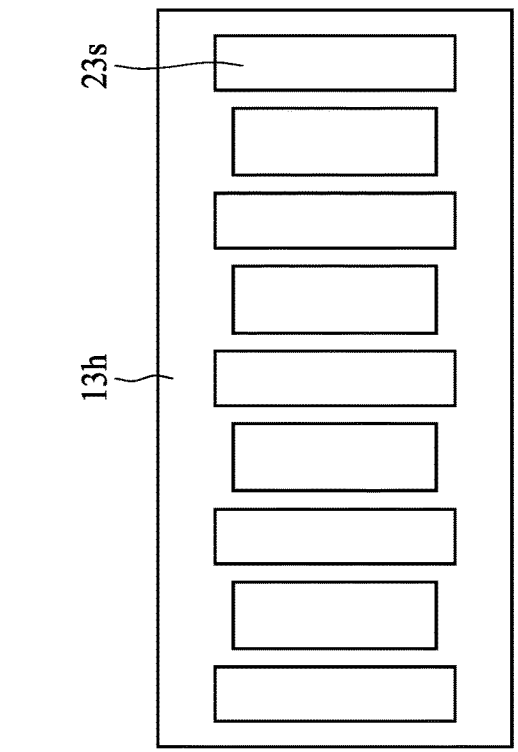
FIG. 5A'

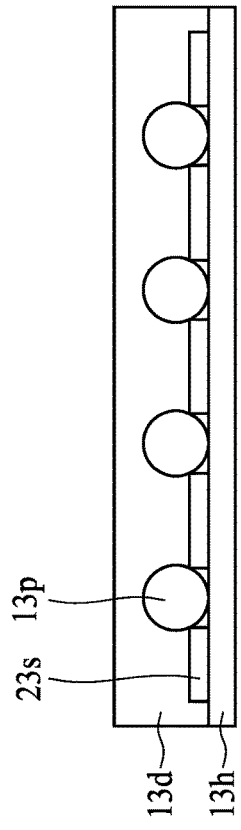
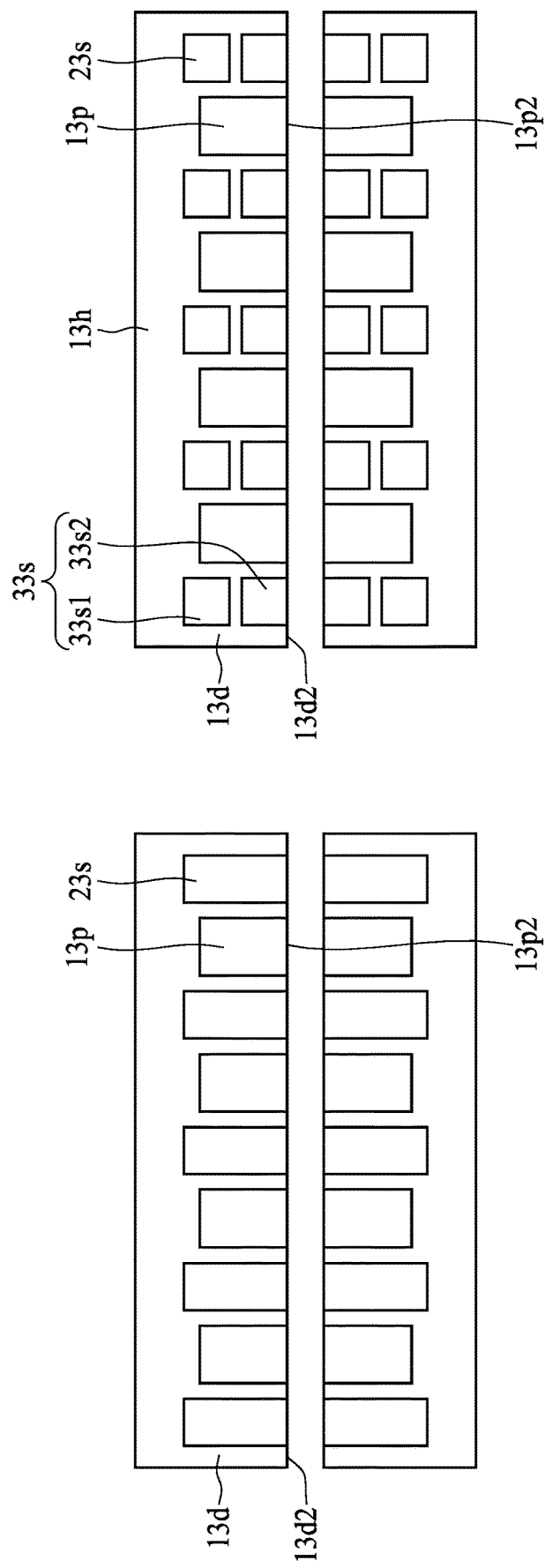
FIG. 5B
FIG. 5B'
FIG. 5B"

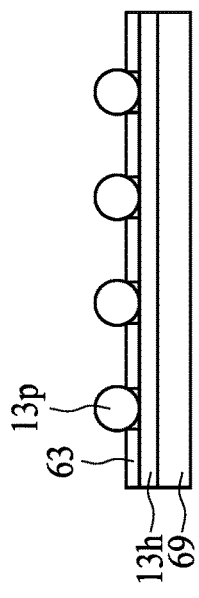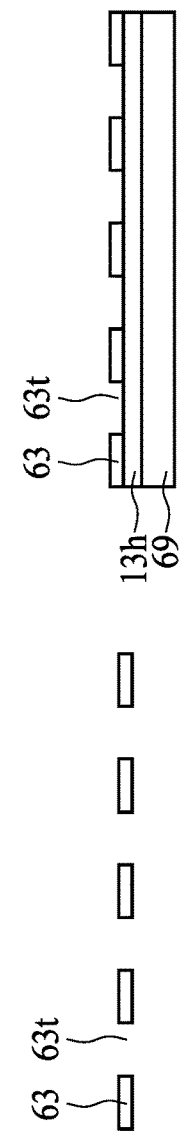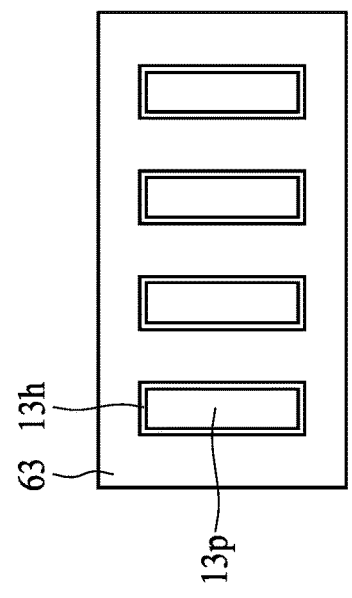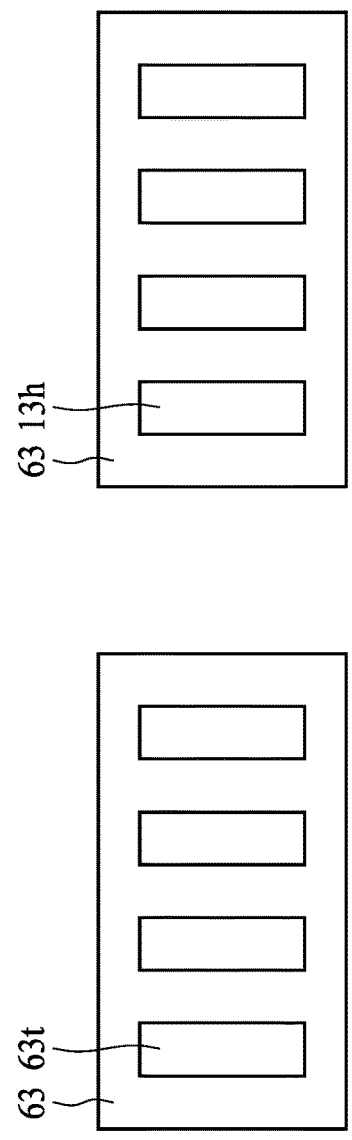

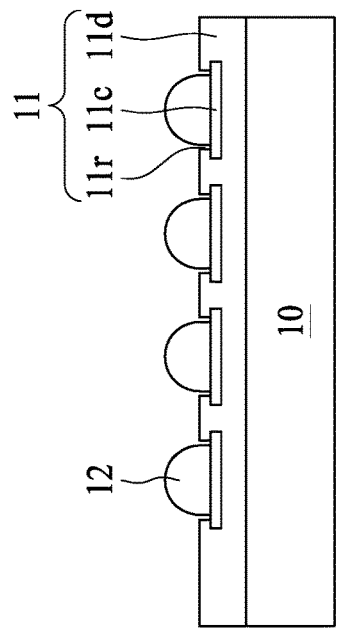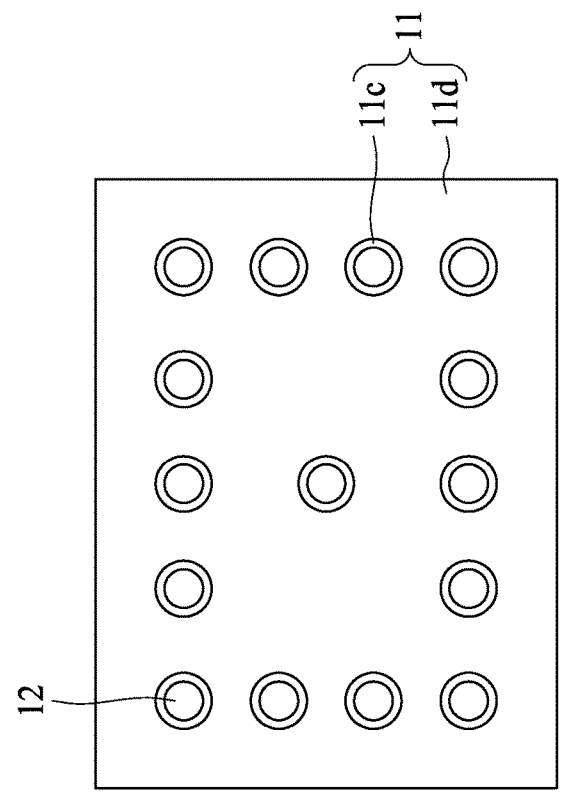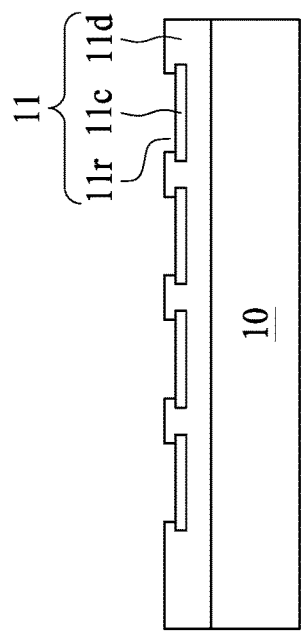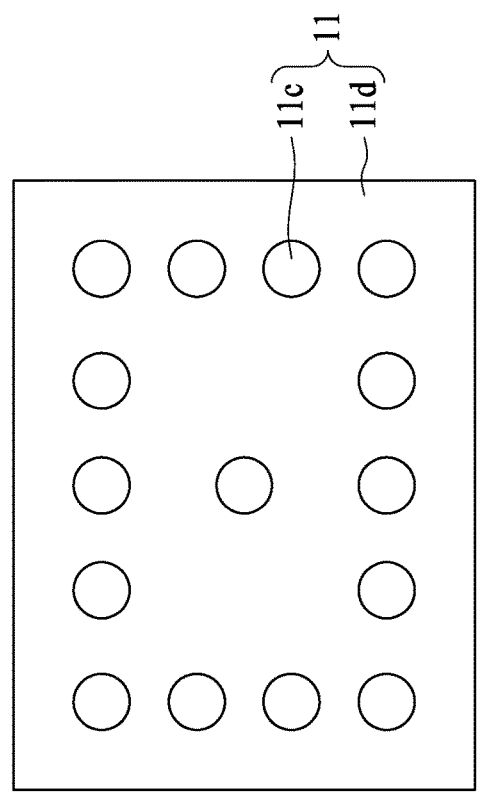
FIG. 8A  FIG. 8A'  FIG. 8B  FIG. 8B'

SEMICONDUCTOR DEVICE PACKAGE AND METHOD OF MANUFACTURING THE SAME

BACKGROUND

1. Technical Field

The present disclosure relates to a semiconductor device package and a method of manufacturing the same, and more particularly to a semiconductor device package including an antenna structure and a method of manufacturing the same.

2. Description of the Related Art

Wireless communication devices, such as cell phones, typically include antennas for transmitting and receiving radio frequency (RF) signals. A wireless communication device includes an antenna and a communication module disposed on a substrate. The antenna may be communicated with the communication module or the substrate through a feeding line. It is desirable to provide a feeding line to meeting the requirements for designing the wireless communication device.

SUMMARY

In accordance with some embodiments of the present disclosure, a semiconductor device package includes a substrate, and interconnection structure and a package body. The interconnection structure is disposed on the substrate. The interconnection structure has a conductive structure and a first dielectric layer covering a portion of the conductive structure. The conductive structure defines an antenna feeding point. The package body is disposed on the substrate and covers the interconnection structure.

In accordance with some embodiments of the present disclosure, a semiconductor device package includes a substrate, an interconnection structure and an antenna layer. The interconnection structure is disposed on the substrate. The interconnection structure has a conductive structure and a first dielectric layer. The conductive structure defines an antenna feeding point. The first dielectric layer covers a lateral surface of the conductive structure and exposes a first surface of the conductive structure facing away from the substrate. The antenna layer is disposed on the interconnection structure and electrically connected to the conductive structure. A roughness of the first surface of the conductive structure is different from a roughness of the second surface of the conductive structure.

In accordance with some embodiments of the present disclosure, a method of manufacturing a semiconductor device package includes (a) disposing an interconnection structure on a substrate, the interconnection module having a conductive pillar and a first dielectric layer covering a portion of the conductive pillar, the conductive pillar defining an antenna feeding point; (b) forming a package body to cover the interconnection structure; and (c) removing a portion of the package body and a portion of the first dielectric layer to expose a first surface of the conductive pillar facing away from the substrate.

BRIEF DESCRIPTION OF THE DRAWINGS

FIG. 5A, FIG. 5A', FIG. 5A", FIG. 5B, FIG. 5B' and FIG. 5B" illustrates a semiconductor manufacturing method in accordance with some embodiments of the present disclosure.

FIG. 6A, FIG. 6A', FIG. 6B, FIG. 6B', FIG. 6C and FIG. 6C' illustrates a semiconductor manufacturing method in accordance with some embodiments of the present disclosure.

Figure 1A:
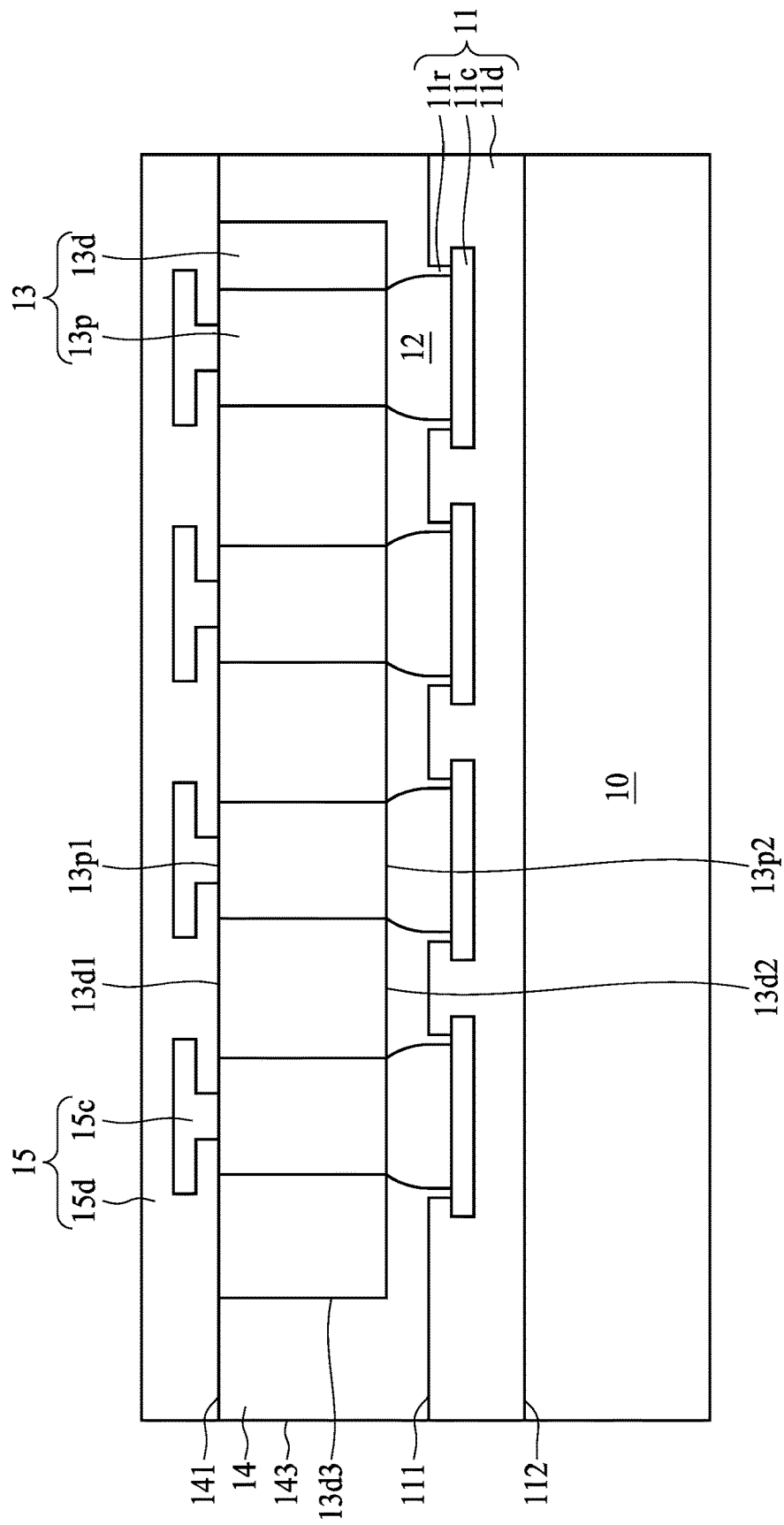
FIG. 1A illustrates a cross-sectional view of a semiconductor device package, in accordance with some embodiments of the present disclosure.

Common reference numerals are used throughout the drawings and the detailed description to indicate the same or similar components. The present disclosure will be readily understood from the following detailed description taken in conjunction with the accompanying drawings.

DETAILED DESCRIPTION

FIG. 1A illustrates a cross-sectional view of a semiconductor device package 1, in accordance with some embodiments of the present disclosure. The semiconductor device package 1 includes a carrier 10, circuit layers 11, 15, electrical contacts 12, an interconnection structure 13 and a package body 14.

In some embodiments, the carrier 10 may be or include a glass substrate. The carrier 10 may include conductive pad(s), trace(s), and interconnection(s) (e.g. via(s)). In some embodiments, the carrier 10 may include transparent material. In some embodiments, the carrier 10 may include opaque material. The carrier 10 includes a material having a dielectric constant (Dk) less than approximately 5. The carrier 10 includes a material having a Dk less than approximately 3. The carrier 10 includes a material having a loss tangent or dissipation factor (Df) less than approximately 0.005. The carrier 10 includes a material having a loss tangent or Df less than approximately 0.003.

The circuit layer 11 (or building-up circuit) is disposed on the carrier 10. The circuit layer 11 has a surface 111 facing away from the carrier 10 and a surface 112 opposite to the surface 111. In some embodiments, the surface 112 of the circuit layer 11 is in contact with the carrier 10. In other embodiments, the surface 112 of the circuit layer 11 is connected to the carrier 10 through an adhesive layer (e.g., a die attach film, DAF, not shown in the drawing).

The circuit layer 11 includes one or more conductive layers (e.g., redistribution layers, RDLs) 11c and one or more dielectric layers 11d. A portion of the conductive layer 11c is covered or encapsulated by the dielectric layer 11d while another portion of the conductive layer 11c is exposed from the dielectric layer 11d to provide electrical connections. For example, the dielectric layer 11d may define one or more recesses 11r to expose the portion of the conductive layer 11c. In some embodiments, the conductive layer 11c may define or include an antenna or an antenna pattern.

In some embodiments, the dielectric layer 11d may include pre-impregnated composite fibers (e.g., pre-preg), Borophosphosilicate Glass (BPSG), silicon oxide, silicon nitride, silicon oxynitride, Undoped Silicate Glass (USG), any combination of two or more thereof, or the like. Examples of a pre-preg may include, but are not limited to, a multi-layer structure formed by stacking or laminating a number of pre-impregnated materials/sheets. In some embodiments, there may be any number of conductive layers 11c depending on design specifications. In some embodiments, the conductive layer 11c is formed of or includes gold (Au), silver (Ag), copper (Cu), platinum (Pt), palladium (Pd), other metal(s) or alloy(s), or a combination of two or more thereof.

The electrical contacts 12 are disposed between the interconnection structure 13 and the circuit layer 11. The electrical contacts 12 electrically connect the interconnection structure 13 with the circuit layer 11 (e.g., the conductive layer 11r exposed from the dielectric layer 11d). The electrical contacts 12 are disposed within the recesses 11r defined by the dielectric layer 11d. In some embodiments, each of the electrical contacts 12 is spaced apart from the corresponding recess 11r. For example, there is a gap between each of the electrical contacts 12 and a sidewall of the corresponding recess 11r. In other embodiments, each of the electrical contacts 12 may fully fill the corresponding recess 11r. In some embodiments, the electrical contacts 12 may include solder balls.

The interconnection structure 13 is disposed on the surface 111 of the circuit layer 11. The interconnection structure 13 is electrically connected to the circuit layer 11 (e.g., to the conductive layer 11c) through the electrical contacts 12. The interconnection structure 13 is electrically connected to the circuit layer 15. The interconnection structure 13 electrically connects the circuit layer 15 with the circuit layer 11. In some embodiments, the interconnection structure 13 is spaced apart from the circuit layer 11. For example, there is a gap between the interconnection suture 13 and the circuit layer 11. In some embodiments, the interconnection structure 13 is in contact with the circuit layer 15. In other embodiments, the interconnection structure 13 may be connected to the circuit layer 15 through a DAF (not shown in the drawing).

In some embodiments, the interconnection structure 13 includes a dielectric layer 13d and one or more conductive structures 13p. The dielectric layer 13d (or the interconnection structure 13) has a surface 13d1 facing the circuit layer 15, a surface 13d2 facing the circuit layer 11 and a lateral surface 13d3 extending between the surface 13d1 and the surface 13d2. The dielectric layer 13d covers a portion of the conductive structures 13p and exposes another portion of the conductive structures 13p for electrical connections. For example, the dielectric layer 13d covers a lateral surface of each of the conductive structures 13p. For example, the dielectric layer 13d exposes a surface 13p1 and a surface 13p2 of each of the conductive structures 13p. For example, a thickness of the interconnection structure 13 is substantially the same as a height of each of the conductive structures 13p. For example, the surface 13p1 of the conductive structures 13 is substantially coplanar with the surface 13d1 of the dielectric layer 13d, and the surface 13p2 of the conductive structures 13p is substantially coplanar with the surface 13d2 of the dielectric layer 13d. In some embodiments, the conductive structures 13p may be or include conductive pillars or conductive pins. In some embodiments, at least a portion of the conductive structures 13p may define an antenna or an antenna pattern. For example, at least a portion of the conductive structures 13p may define a feeding point or a feeding line of the antenna (e.g., the antenna defined by the conductive layer 11c) for signal transmission.

In some embodiments, a roughness of the surface 13d1 of the dielectric layer 13d is different from a roughness of the surface 13d2 of the dielectric layer 13d. In some embodiments, the roughness of the surface 13d1 of the dielectric layer 13d is less than the roughness of the surface 13d2 of the dielectric layer 13d. In some embodiments, a roughness of the surface 13p1 of the conductive structures 13p is different from a roughness of the surface 13p2 of the conductive structures 13p. In some embodiments, the roughness of the surface 13p1 of the conductive structures 13p is less than the roughness of the surface 13p2 of the conductive structures 13p. In some embodiments, an aspect ratio of each of the conductive structures 13p (e.g., a ratio of a height of each conductive structures 13p to a diameter/width of the conductive structure) is higher than 6:1.

Figure 1B:
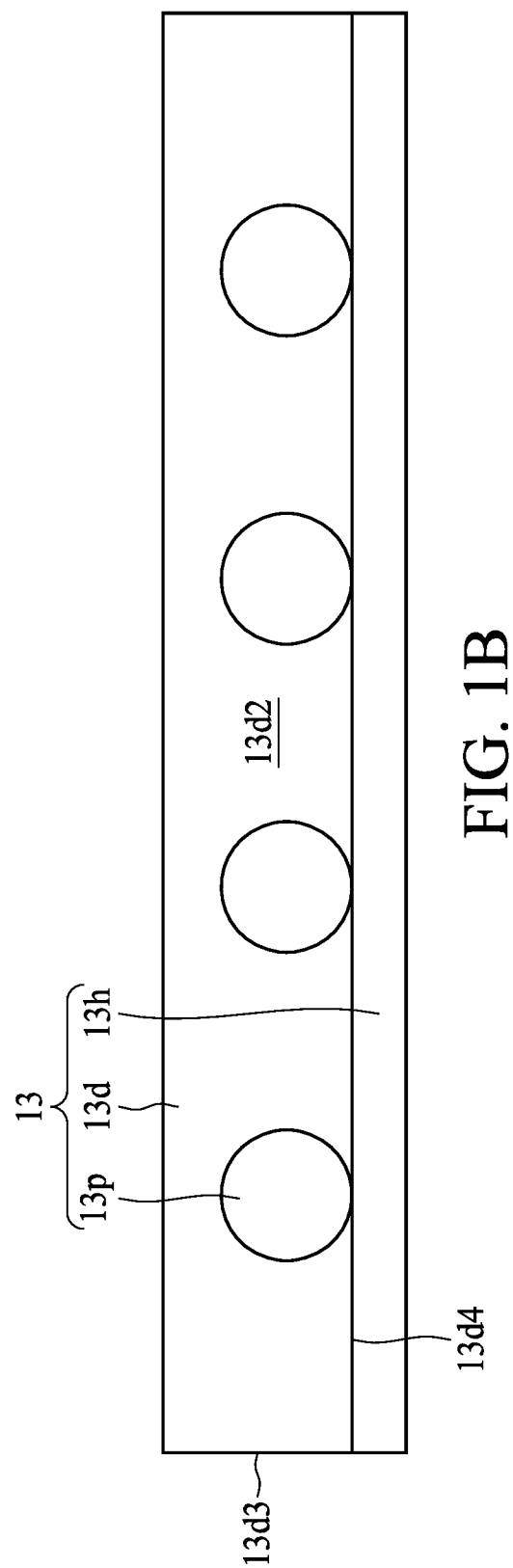
FIG. 1B which illustrates a bottom view of a portion of the interconnection structure as shown in FIG. 1A, in accordance with some embodiments of the present disclosure.

As shown in FIG. 1B, which illustrates a portion of a bottom view of the interconnection structure 13 as shown in FIG. 1A, the interconnection structure 13 may further include an adhesive layer 13h. The adhesive layer 13h is disposed on a lateral surface 13d4, which is adjacent to the lateral surface 13d3, of the dielectric layer 13d. In some embodiments, a portion of the lateral surface of each of the conductive structures 13p is connected to the adhesive layer 13h. In some embodiments, a portion of the lateral surface of each of the conductive structures 13p is in contact with the adhesive layer 13h.

Figure 1C:
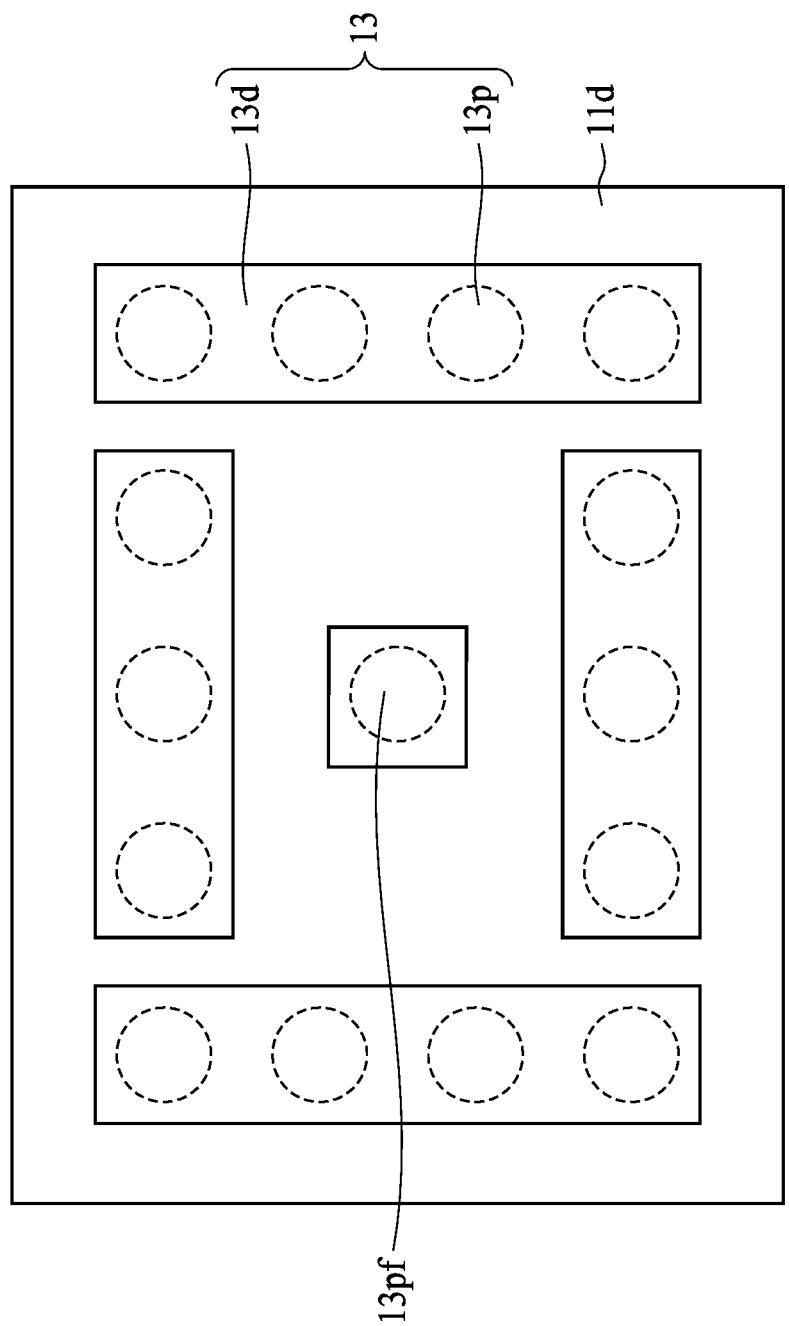
FIG. 1C which illustrates a bottom view of the interconnection structure as shown in FIG. 1A, in accordance with some embodiments of the present disclosure.

In some embodiments, as shown in FIG. 1C, which illustrate a bottom view of the interconnection structure, the interconnection structure may include a plurality of portions, each same as or similar to the portion of the interconnection structure 13 as shown in FIG. 1B. For example, the interconnection structure as shown in FIG. 1C may include an interconnection structure 13pf located at or adjacent to the center of the dielectric layer 11d. The interconnection structure 13pf may function as a feeding point of the antenna. As shown in FIG. 1C, the portions of the interconnection structure 13 are separated from each other and surround the interconnection structure 13pf. In some embodiments, the portions of the interconnection structure 13 may be connected to ground. In other embodiments, each of the portions of the interconnection structure 13 may be connected to its adjacent portions of the interconnection structure 13.

In some embodiments, the dielectric layer 13d may include pre-impregnated composite fibers (e.g., pre-preg), BPSG, silicon oxide, silicon nitride, silicon oxynitride, USG, any combination of two or more thereof, or the like. Examples of a pre-preg may include, but are not limited to, a multi-layer structure formed by stacking or laminating a number of pre-impregnated materials/sheets. In some embodiments, the conductive structures 13p are formed of or include Au, Ag, Cu, Pt, Pd, other metal(s) or alloy(s), or a combination of two or more thereof.

The package body 14 is disposed between the circuit layer 11 and the circuit layer 15. The package body 14 covers a portion of the interconnection structure 13. For example, the package body 14 is in contact with the lateral surface 13d3 and the surface 13d2 of the dielectric layer 13d of the interconnection structure 13. The package body 14 exposes the surface 13d1 of the dielectric layer 13d of the interconnection structure 13. For example, a surface 141 of the package body 14 is substantially coplanar with the surface 13d1 of the dielectric layer 13d of the interconnection structure 13. For example, the surface 141 of the package body 14 is in contact with the circuit layer 15. In some embodiments, the package body 14 may further extend within the recess 11r defined by the dielectric layer 11d of the circuit layer 11. For example, the package body 14 may further cover or contact a portion of the electrical contacts 12.

In some embodiments, the package body 14 includes an epoxy resin including fillers, a molding compound (e.g., an epoxy molding compound or other molding compound), a polyimide, a phenolic compound or material, a material including a silicone dispersed therein, or a combination thereof.

The circuit layer 15 (or building-up circuit) is disposed on the interconnection structure 13 and the package body 14. In some embodiments, the circuit layer 15 is in contact with the interconnection structure 13 and the package body 14. In other embodiments, the circuit layer 15 is connected to the interconnection structure 13 and the package body 14 through an adhesive layer (e.g., a DAF, not shown in the drawing).

The circuit layer 15 includes one or more conductive layers (e.g., redistribution layers, RDLs) 15c and one or more dielectric layers 15d. A portion of the conductive layer 15c is covered or encapsulated by the dielectric layer 15d while another portion of the conductive layer 15c is exposed from the dielectric layer 15d to provide electrical connections. The exposed portion of the conductive layer 15c is electrically connected to the interconnection structure 13. In some embodiments, the conductive layers 15c may be or include an antenna layer.

In some embodiments, the dielectric layer 15d may include pre-impregnated composite fibers (e.g., pre-preg), BPSG, silicon oxide, silicon nitride, silicon oxynitride, USG, any combination of two or more thereof, or the like. Examples of a pre-preg may include, but are not limited to, a multi-layer structure formed by stacking or laminating a number of pre-impregnated materials/sheets. In some embodiments, there may be any number of conductive layers 15c depending on design specifications. In some embodiments, the conductive layer 15c is formed of or include Au, Ag, Cu, Pt, Pd, other metal(s) or alloy(s), or a combination of two or more thereof.

Figure 2A:
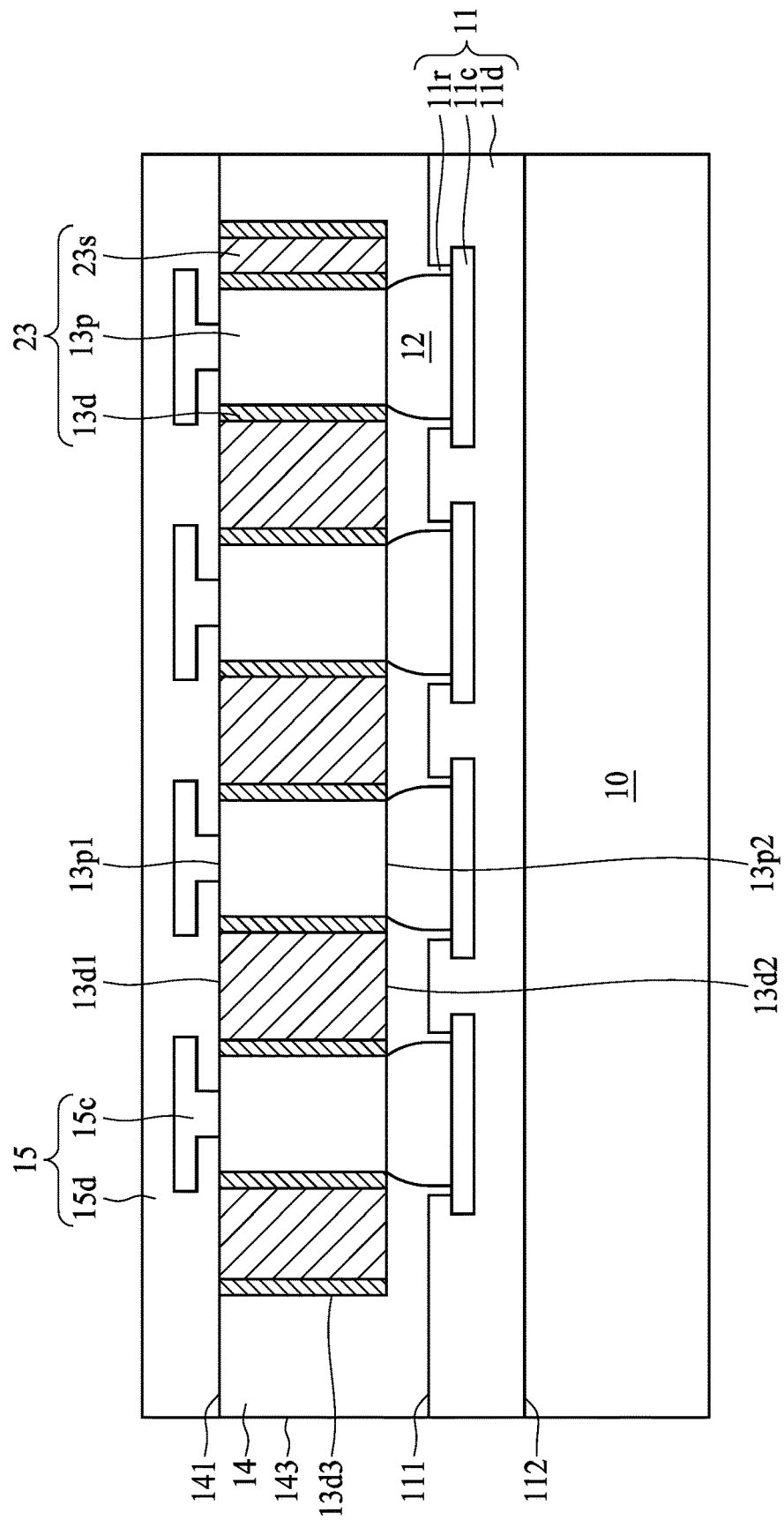
FIG. 2A illustrates a cross-sectional view of a semiconductor device package, in accordance with some embodiments of the present disclosure.

FIG. 2A illustrates a cross-sectional view of a semiconductor device package 2, in accordance with some embodiments of the present disclosure. The semiconductor device package 2 is similar to the semiconductor device package 1 as shown in FIG. 1A, and some of the differences therebetween are described below.

Figure 2B:
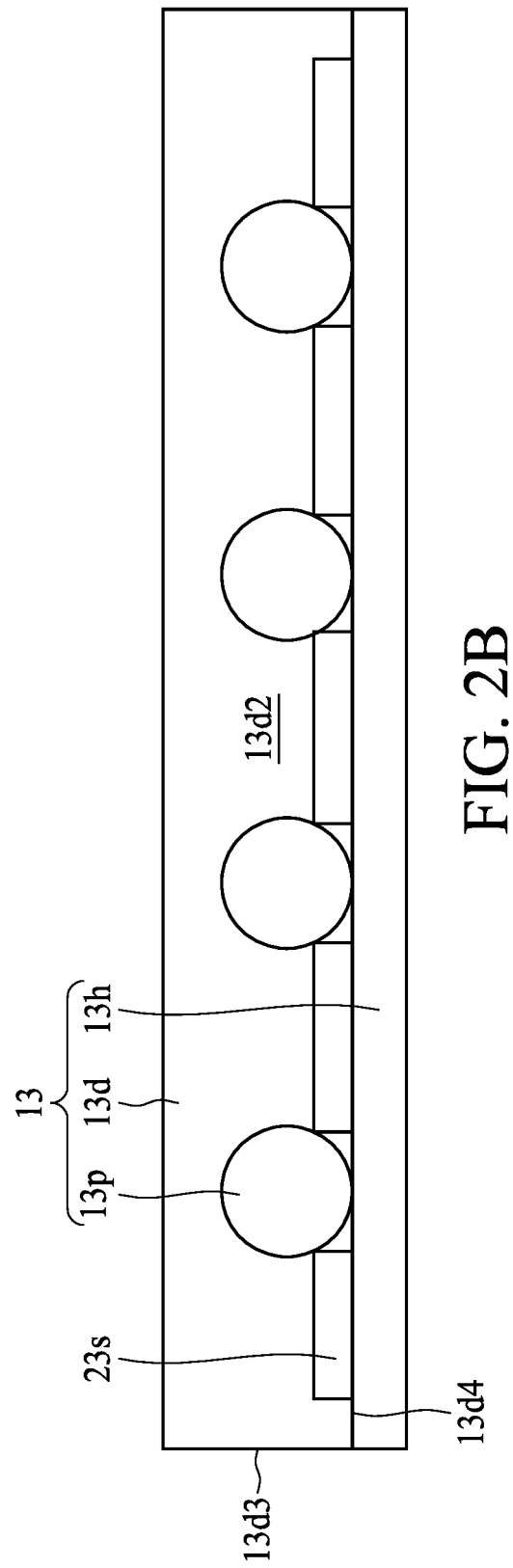
FIG. 2B which illustrates a bottom view of a portion of the interconnection structure as shown in FIG. 2A, in accordance with some embodiments of the present disclosure.

In some embodiments, compared with the interconnection structure 13 as shown in FIG. 1A, the interconnection structure 23 further includes a dam structure 23s. The dam structure 23s is disposed adjacent to each of the conductive structure 13. As shown in FIG. 2B, which illustrates a portion of a bottom view of the interconnection structure 23 as shown in FIG. 2A, the dam structure 23s may define a plurality of trenches to accommodate the conductive structures 13p. The edge of the dam structure 23s may be in contact with the conducive structures 13, which can prevent the conductive structures 13p from rolling or moving during the manufacturing processes (the detailed steps/operations for forming the interconnection structure 23 would be described below).

In some embodiments, the dam structure 23s may be or include a solder mask or a dielectric material, such as pre-impregnated composite fibers (e.g., pre-preg), BPSG, silicon oxide, silicon nitride, silicon oxynitride, USG, any combination of two or more thereof, or the like.

Figure 3A:
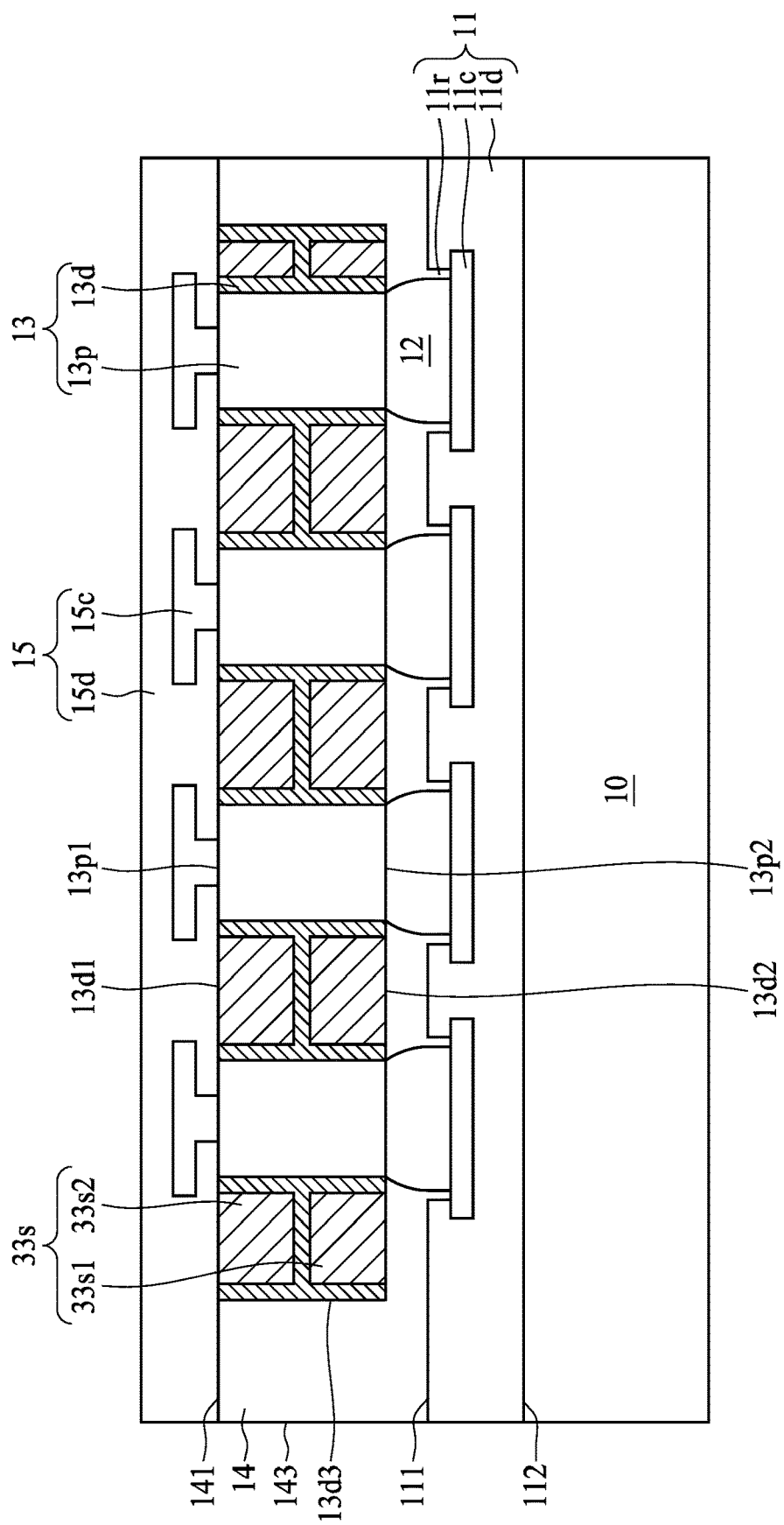
FIG. 3A illustrates a cross-sectional view of a semiconductor device package, in accordance with some embodiments of the present disclosure.

FIG. 3A illustrates a cross-sectional view of a semiconductor device package 3A, in accordance with some embodiments of the present disclosure. The semiconductor device package 3A is similar to the semiconductor device package 2 as shown in FIG. 2A, and some of the differences therebetween are described below.

The dam structure 33s includes portions 32s1 and 32s2. The portion 32s1 and the portion 32s2 of the dam structure 33s are separated from each other. For example, there is a gap between the portion 32s1 and the portion 32s2 of the dam structure 33s. The dielectric layer 13d may extend within the gap between the portion 32s1 and the portion 32s2 of the dam structure 33s. In some embodiments, the dam structure 33s may include any number of portions separated from each other.

Figure 3B:
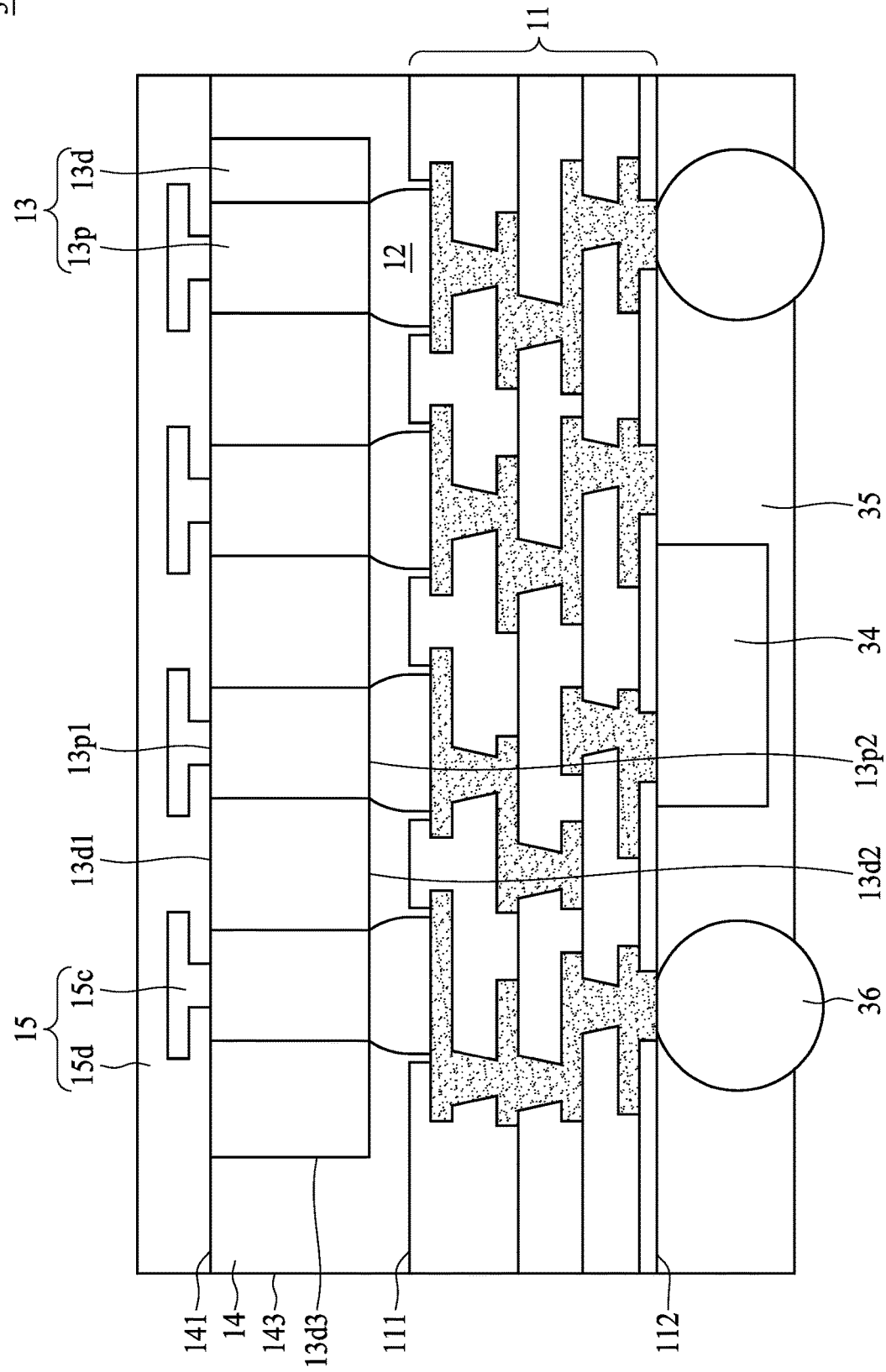
FIG. 3B illustrates a cross-sectional view of a semiconductor device package, in accordance with some embodiments of the present disclosure.

FIG. 3B illustrates a cross-sectional view of a semiconductor device package 3B, in accordance with some embodiments of the present disclosure. The semiconductor device package 3B is similar to the semiconductor device package 1 as shown in FIG. 1A, and some of the differences therebetween are described below.

As shown in FIG. 3B, the circuit layer 11 include multiple dielectric layers and conductive layers. An electronic component 34 is disposed on the surface 112 of the circuit layer 11 and electrically connected to the conductive layers of the circuit layer 11. The electronic component 11 can be electrically connected with the interconnection structure 13 and the circuit layer 15 through the circuit layer 11. The electronic component 11 may be a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof.

Electrical contacts 36 (e.g., solder balls) are disposed on the surface 112 of the circuit layer 11. The electrical contacts 36 are electrically connected to the conductive layers of the circuit layer 11. The electrical contacts 36 can provide electrical connections between the semiconductor package device 3B and external components (e.g. external circuits or circuit boards). In some embodiments, the electrical contact 36 includes a controlled collapse chip connection (C4) bump, a ball grid array (BGA) or a land grid array (LGA).

The package body 35 is disposed on the surface 112 of the circuit layer 11. The package body 35 covers the electronic component 34. The package body 35 covers a portion of the electrical contacts 36 and exposes another portions of the electrical contacts 36. In some embodiments, the package body 35 includes an epoxy resin having fillers dispersed therein.

Figure 4C:
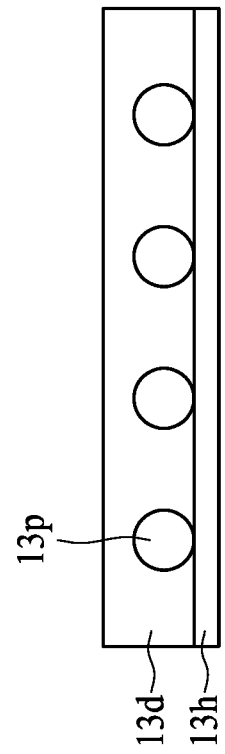
FIG. 4A, FIG. 4A', FIG. 4B, FIG. 4B', FIG. 4C, FIG. 4C', FIG. 4D, FIG. 4D', FIG. 4E and FIG. 4E' illustrates a semiconductor manufacturing method in accordance with some embodiments of the present disclosure.

FIG. 4A, FIG. 4B, FIG. 4C, FIG. 4D and FIG. 4E illustrate cross-sectional views of a semiconductor manufacturing method, in accordance with some embodiments of the present disclosure. FIG. 4A', FIG. 4B', FIG. 4C', FIG. 4D' and FIG. 4E' illustrate top views of the respective structures as illustrated in FIG. 4A, FIG. 4B, FIG. 4C, FIG. 4D and FIG. 4E, in accordance with some embodiments of the present disclosure. In some embodiments, the method in FIG. 4A, FIG. 4A', FIG. 4B, FIG. 4B', FIG. 4C, FIG. 4C', FIG. 4D, FIG. 4D', FIG. 4E and FIG. 4E' can be used to manufacture the interconnection structure 13 as shown in FIG. 1A.

Referring to FIG. 4A and FIG. 4A', a carrier 49 is provided. In some embodiments, the carrier 49 may include an adhesive layer 13h disposed thereon.

Referring to FIG. 4B and FIG. 4B', one or more conductive structures 13p (e.g., conductive pillars/columns/pins/posts) are disposed on the adhesive layer 13h. In some embodiments, a lateral surface (or sidewall) of the conductive structures 13p are connected to the adhesive layer 13h. For example, the conductive structures 13p lie down on the adhesive layer 13h. In some embodiments, the conductive structures 13 are parallel to each other and spaced apart from each other.

Referring to FIG. 4C and FIG. 4C', a dielectric layer 13d is formed on the adhesive layer 13h to cover the conductive structures 13p. In some embodiments, the dielectric layer 13d fully covers the conductive structures 13p. For example, the dielectric layer 13d covers both terminals of the conductive structures 13p. In some embodiments, the dielectric layer 13d may be formed by, for example, lamination, molding or any other suitable processes. Then, the carrier 49 is removed from the adhesive layer 13h (e.g., de-carrier) as shown in FIG. 4D and FIG. 4D'.

Figure 4D:
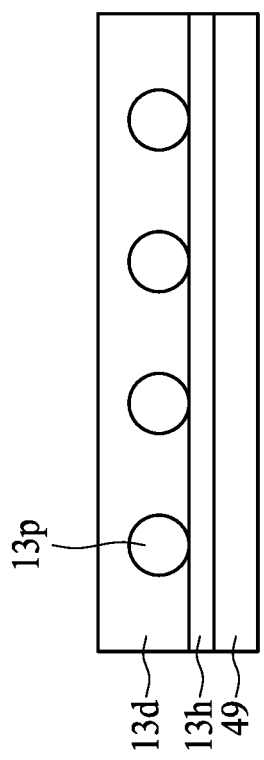
Figure 4C:
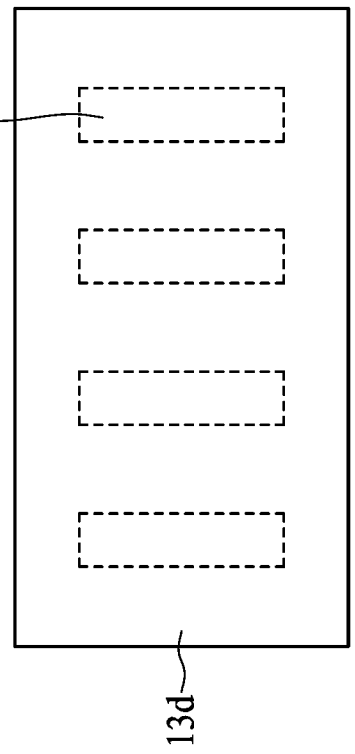
Figure 4D:
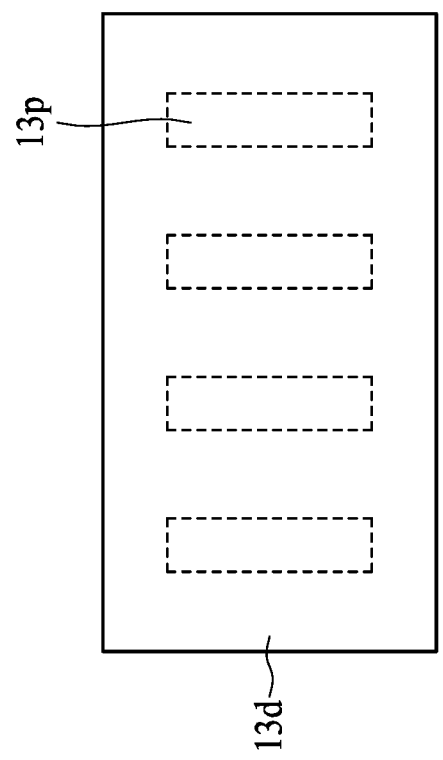

Referring to FIG. 4E and FIG. 4E', singulation may be carried out to separate (or divide) the structure as shown in FIG. 4D and FIG. 4D' into two parts. For example, the singulation may be carried out through the dielectric layer 13d and the conductive structures 13p. In each individual part, a portion of the conductive structures (e.g., a surface 13p2) is exposed from the dielectric layer 13d. In some embodiments, the singulation may be carried out by, for example, cutting or any other suitable processes.

FIG. 5A and FIG. 5B illustrate cross-sectional views of a semiconductor manufacturing method, in accordance with some embodiments of the present disclosure. FIG. 5A' and FIG. 5B' illustrate top views of the respective structures as illustrated in FIG. 5A and FIG. 5B, in accordance with some embodiments of the present disclosure. FIG. 5A" and FIG. 5B" illustrate top views of the respective structures as illustrated in FIG. 5A and FIG. 5B, in accordance with some embodiments of the present disclosure. In some embodiments, the method in FIG. 5A, FIG. 5A', FIG. 5B and FIG. 5B' can be used to manufacture the interconnection structure 23 as shown in FIG. 2A. In some embodiments, the method in FIG. 5A, FIG. 5A", FIG. 5B and FIG. 5B" can be used to manufacture the interconnection structure 33 as shown in FIG. 3A. In some embodiments, the operations as shown in FIG. 5A and FIG. 5B are similar to the operations as shown in FIG. 4A, FIG. 4B, FIG. 4C, FIG. 4D and FIG. 4E, and some of the differences therebetween are described below.

Referring to FIG. 5A and FIG. 5A', prior to the placement of the conductive structures 13p on the adhesive layer 13h, a dam structure 23s is disposed on the adhesive layer 13h. Two adjacent dam structures 23s are spaced apart from each other to define a trench to accommodate the conductive structures 13p. The dam structure 23s can prevent the conductive structures 13p from rolling or moving during the manufacturing processes. In some embodiments, each dam structure 23s may include one piece as shown in FIG. 5A'. In other embodiments, as shown in FIG. 5A", each dam structure 33s may include many pieces 33s1, 33s2 separated from each other.

Then, the operations same as or similar to the operations as shown in FIG. 4C, FIG. 4D and FIG. 4E (e.g., the formation of the dielectric layer 13d, de-carrier, singulation and the like) may be carried out to the structures as shown in FIG. 5A, 5A' and FIG. 5A" to form the structures as shown in FIG. 5B, 5B' and FIG. 5B".

FIG. 6A, FIG. 6B and FIG. 6C illustrate cross-sectional views of a semiconductor manufacturing method, in accordance with some embodiments of the present disclosure. FIG. 6A', FIG. 6B' and FIG. 6C' illustrate top views of the respective structures as illustrated in FIG. 6A, FIG. 6B and FIG. 6C, in accordance with some embodiments of the present disclosure. In some embodiments, the method in FIG. 6A, FIG. 6A', FIG. 6B, FIG. 6B', FIG. 6C and FIG. 6C' can be used to manufacture the interconnection structure 23 as shown in FIG. 2A. In some embodiments, the operations as shown in FIG. 6A, FIG. 6B and FIG. 6C are similar to the operations as shown in FIGS. 5A and 5B, and some of the differences therebetween are described below.

Referring to FIG. 6A and FIG. 6A', a patterned dielectric layer 63 is provided. The patterned dielectric layer 63 includes one or more trenches 63t for accommodating the conductive structures 13p. The patterned dielectric layer 63 may function as the dam structure 23 as shown in FIG. 5A to prevent the conductive structures 13p from rolling or moving during the manufacturing processes.

Referring to FIG. 6B and FIG. 6B', the patterned dielectric layer 63 is disposed on the adhesive layer 13h. In some embodiments, the patterned dielectric layer 63 may be connected to the adhesive layer 13h by, for example, lamination or other suitable processes.

Referring to FIG. 6C and FIG. 6C', the conductive structures 13p are disposed within the respective trenches 63t defined by the patterned dielectric layer 63. Then, the operations same as or similar to the operations as shown in FIG. 4C, FIG. 4D and FIG. 4E (e.g., the formation of the dielectric layer 13d, de-carrier, singulation and the like) may be carried out to the structures as shown in FIG. 6C and FIG. 6C' to form the structure as shown in FIG. 5B and FIG. 5B'.

FIG. 7A, FIG. 7B, FIG. 7C and FIG. 7D illustrate cross-sectional views of a semiconductor manufacturing method, in accordance with some embodiments of the present disclosure.

Figure 7B:
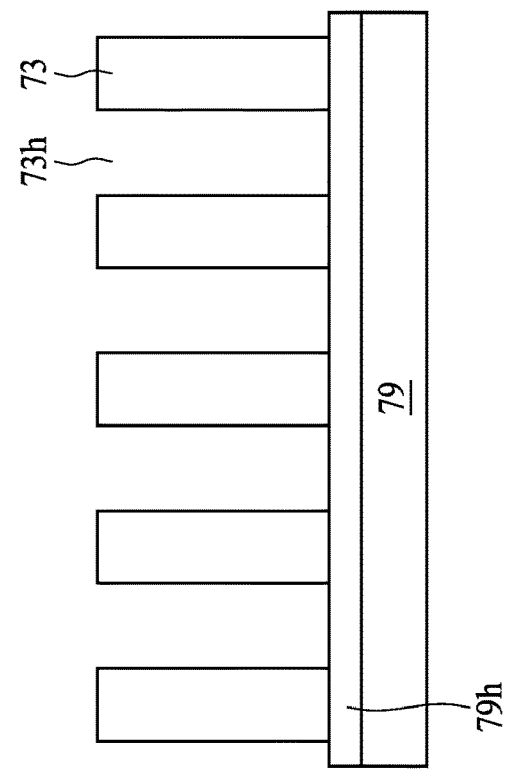
FIG. 7A, FIG. 7B, FIG. 7C and FIG. 7D illustrates a semiconductor manufacturing method in accordance with some embodiments of the present disclosure.
Figure 7A:
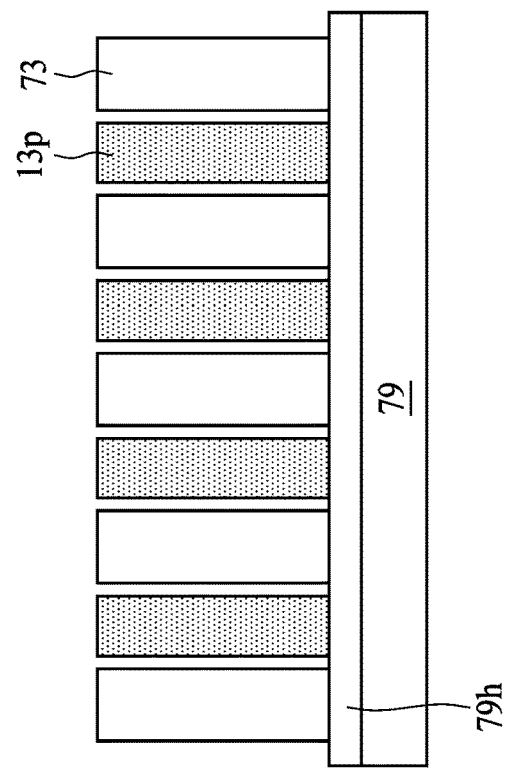

Referring to FIG. 7A, a carrier 79 is provided. In some embodiments, the carrier 79 may include an adhesive layer 79h disposed thereon. A patterned dielectric layer 73 is disposed on the adhesive layer 79h. The patterned dielectric layer 73 includes one or more openings 73h to expose the adhesive layer 79h.

Referring to FIG. 7B, the conductive structures 13p are disposed with the respective openings 73h. For example, one of the terminals (e.g., a bottom surface) of each conductive structures 13p is connected to the adhesive layer 79h exposed from the patterned dielectric layer 73. For example, a lateral surface is surrounded by the patterned dielectric layer 73. In some embodiments, there is a gap between the lateral surface of the conductive structures 13p and the patterned dielectric layer 73. For example, a diameter (or width) of the openings 73h is larger than a diameter (or width) of the conductive structures 13p. In other embodiments, the diameter (or width) of the openings 73h may be equal to the diameter (or width) of the conductive structures 13p.

Figure 7C:
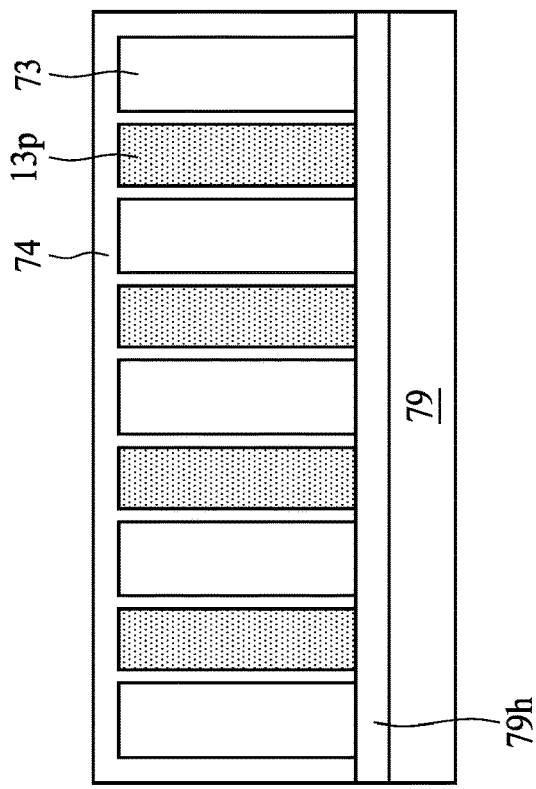

Referring to FIG. 7C, a dielectric layer 74 is formed on the adhesive layer 79h to cover the conductive structures 13p and the dielectric layer 73. In some embodiments, the dielectric layer 74 may further extend within the gap between the conductive structures 13h and the dielectric layer 73. In some embodiments, the dielectric layer 74 may be formed by, for example, lamination, molding or any other suitable processes.

Figure 7D:
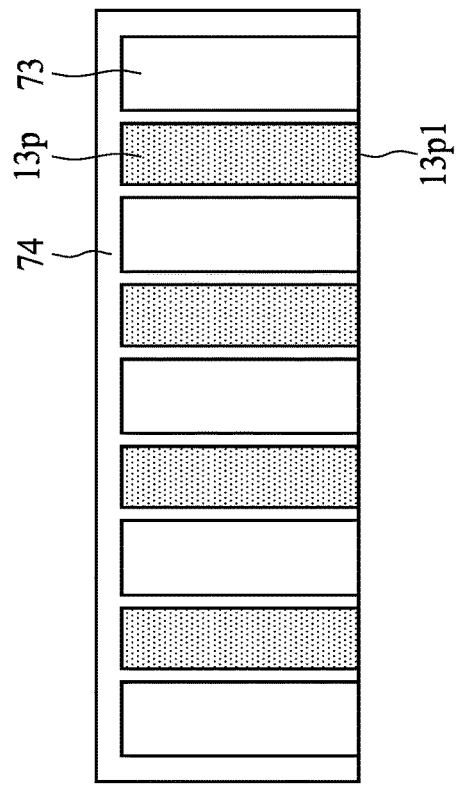

Referring to FIG. 7D, the carrier 79 and the adhesive layer 79h are then removed to expose the surface 13p1 of the conductive structures 13p.

Figure 8D:
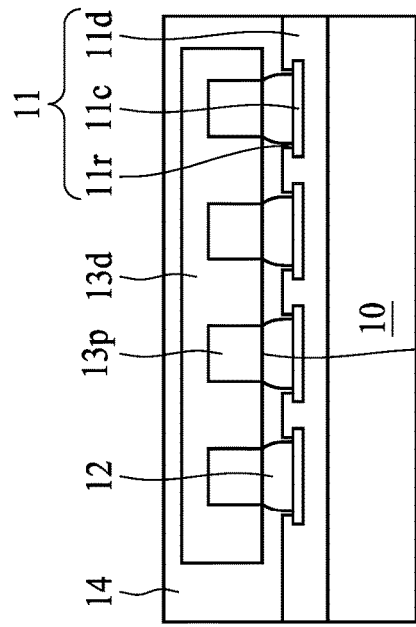
FIG. 8A, FIG. 8A', FIG. 8B, FIG. 8B', FIG. 8C, FIG. 8C', FIG. 8D, FIG. 8D', FIG. 8E
FIG. 8F illustrates a semiconductor manufacturing method in accordance with some embodiments of the present disclosure.
Figure 8D:
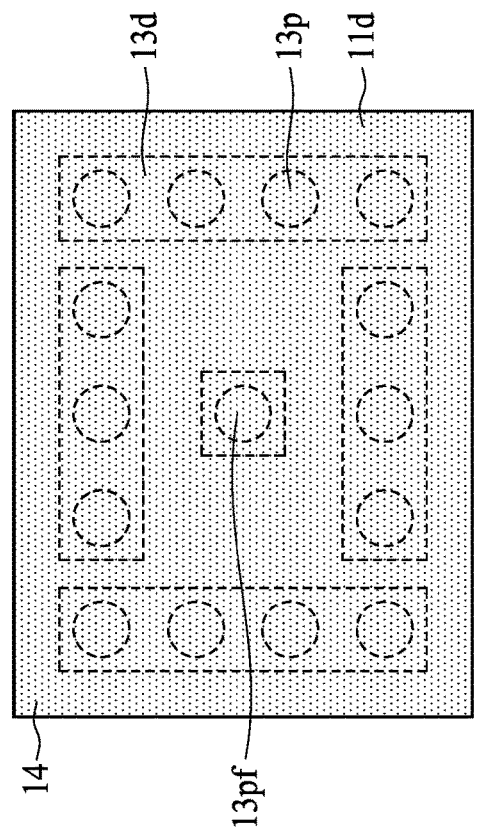

FIG. 8A, FIG. 8B, FIG. 8C, FIG. 8D, FIG. 8E and FIG. 8F illustrate cross-sectional views of a semiconductor manufacturing method, in accordance with some embodiments of the present disclosure. FIG. 8A', FIG. 8B', FIG. 8C' and FIG. 8D' illustrate top views of the respective structures as illustrated in FIG. 8A, FIG. 8B, FIG. 8C and FIG. 8D, in accordance with some embodiments of the present disclosure. In some embodiments, the method in FIG. 8A, FIG. 8A', FIG. 8B, FIG. 8B', FIG. 8C, FIG. 8C', FIG. 8D, FIG. 8D', FIG. 8E and FIG. 8F can be used to manufacture the semiconductor device package device 1 as shown in FIG. 1A.

Referring to FIG. 8A and FIG. 8A', a carrier 10 is provided. In some embodiments, the carrier 10 may be or include a glass carrier. A circuit layer 11 including a conductive layer 11c and a dielectric layer 11d is formed on the carrier 10. The dielectric layer 11d may define one or more recesses 11r to expose a portion of the conductive layer 11c.

Referring to FIG. 8B and FIG. 8B', electrical contacts (e.g., solder balls) 12 are formed within the recesses 11r and electrical connected to the conductive layer 11c exposed from the dielectric layer 11d. In some embodiments, there is a gap between the electrical contacts 12 and the sidewall of the recesses 11r. In some embodiments, the electrical contacts 12 may be formed by, for example, printing or any other suitable processes.

Figure 8C:
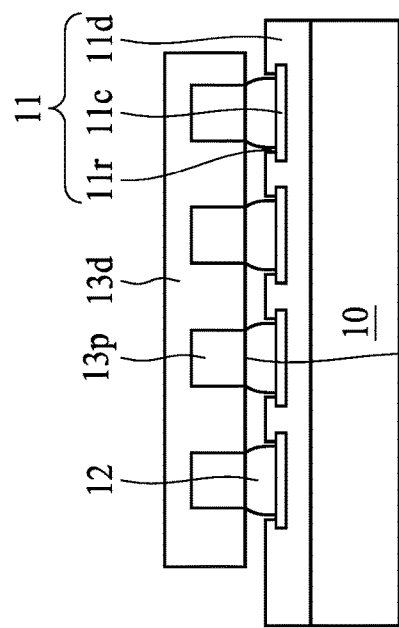
Figure 8C:
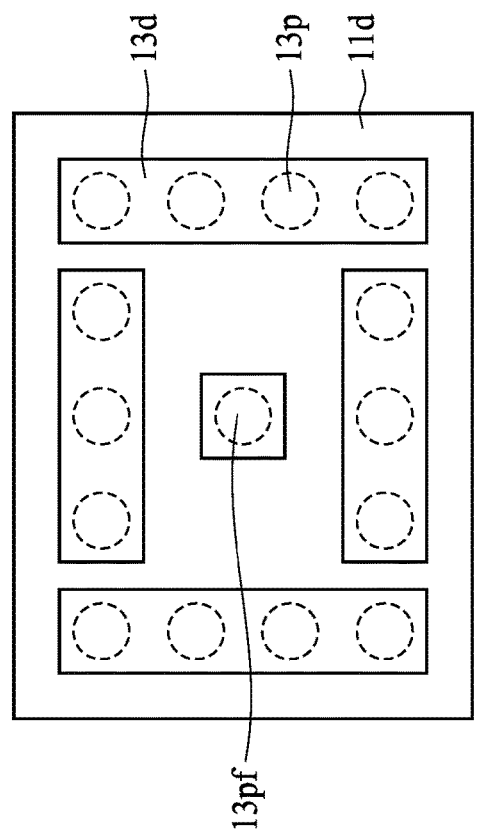

Referring to FIG. 8C and FIG. 8C', the interconnection structure as shown in FIG. 4E and FIG. 4E' is disposed on the circuit layer 11. The surface 13p2 of the conductive structures 13p exposed from the dielectric layer 13d is connected to the electrical contacts 12. In some embodiments, as shown in FIG. 8C', there may be a plurality of interconnection structures as shown in FIG. 4E and FIG. 4E' disposed on the circuit layer 11 and separated from each other depending on different design requirements.

For example, the interconnection structure as shown in FIG. 8C' may include an interconnection structure 13pf located at or adjacent to the center of the dielectric layer 11d. The interconnection structure 13pf may function as a feeding point of the antenna. The interconnection structures including the conductive structures 13p surround the interconnection structure 13pf. In some embodiments, the conductive structures 13p may be connected to ground.

In other embodiments, the interconnection structure as shown in FIG. 8C and FIG. 8C' can be replaced by the interconnection structure as shown in FIG. 5B, FIG. 5B', FIG. 5B" or FIG. 7D.

Referring to FIG. 8D and FIG. 8D', a package body 14 is formed on the circuit layer 11 to cover the interconnection structures and the electrical contacts 12. In some embodiments, the package body 19 may fully cover the interconnection structures and the electrical contacts 12. In some embodiments, the package body 19 may further extend within the gap between the electrical contacts 12 and the sidewall of the recesses 11r. For example, the package body 19 may be in contact with a portion of a top surface of the conductive layer 11c. In some embodiments, the package body 14 is formed by, for example, by a transfer molding technique, a compression technique or any other suitable techniques.

Figure 8F:
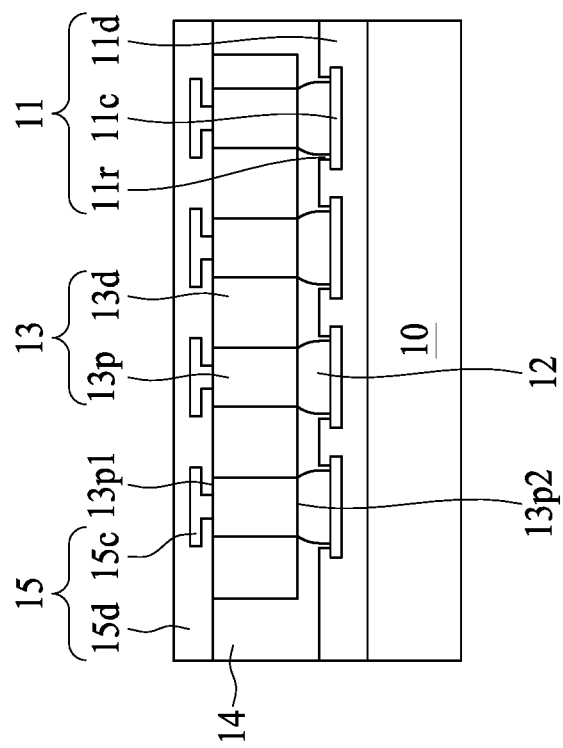
Figure 8E:
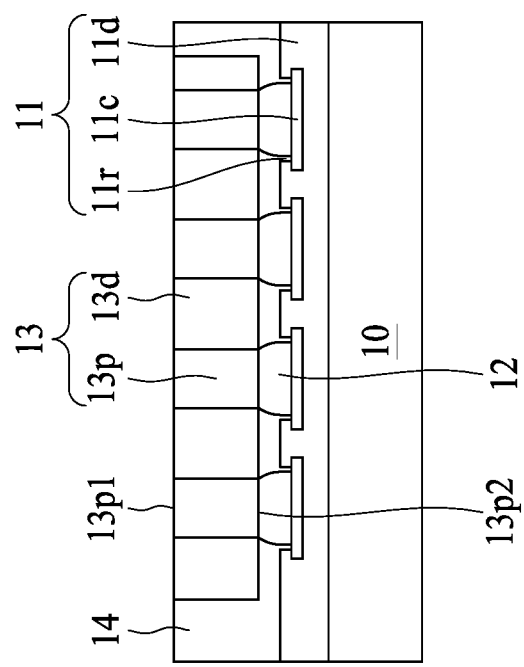

Referring to FIG. 8E, a portion of the package body 14 and the dielectric layer 13d is removed to expose the surface 13p1 of the conductive structures 13p to form the interconnection structure 13. In some embodiments, a portion of the conductive structures 13p may be removed as well. In some embodiments, the package body 14, the dielectric layer 13d and the conductive structures 13p may be removed by, for example, grinding or any other suitable techniques. In some embodiments, since the surface 13p1 and the surface 13p2 of the conductive structures 13p suffered from different processes (e.g., the surface 13p1 suffered from the grinding operation while the surface 13p2 suffered from the sawing operation), a roughness of the surface 13p1 is different from a roughness of the surface 13p2. For example, the roughness of the surface 13p1 is less than the roughness of the surface 13p2.

Referring to FIG. 8F, a circuit layer 15 including a conductive layer 15c and a dielectric layer 15d is formed on the package body 14 and the dielectric layer 13d. The conductive layer 15c is electrically connected to the surface 13p1 of the conductive structures 13p.

In some embodiments, the interconnection structure 13 (including the dielectric layer 13d and the conductive structures 13p) may be replaced by one or more conductive pillars. The conductive pillars may be formed by: (i) forming openings to penetrate the package body 14 to expose the conductive layer 11c of the circuit layer 11; and (ii) filling the openings with a conductive material to form the conductive pillars by plating. Since the conductive pillars may function as a feeding line of an antenna, the conductive pillars should be tall enough to meet the requirements for designing the antenna with the better performance. However, due to the process limitation for forming the openings and plating, the aspect ratio (e.g., a ratio of a height of a conductive pillar to a diameter/width of the conductive pillar) is less than 6:1. Hence, it is difficult to form a tall pillar to meet the requirements for designing the antenna, which would adversely affect the performance of the antenna.

In accordance with the embodiments as shown in FIG. 8A, FIG. 8B, FIG. 8C, FIG. 8D, FIG. 8E and FIG. 8F, the interconnection structure 13 is used as an interconnection module (or a device package) to connect to the circuit layer 11, and the interconnection structure 13 may be formed by the operations as shown in FIG. 4A to FIG. 4E (or in FIG. 5A to FIG. 7D). As shown in FIG. 4A to FIG. 4E, since the conductive structures 13p is pre-formed and can lie down on the adhesive layer 13h, the height of the conductive structures 13p would not be limited by the processes for forming the openings and plating as mentioned above. Hence, it is easier and more flexible to design the conductive structures 13p with the sufficient height to meeting the requirements for designing an antenna.

In addition, since the conductive structures 13p may be pre-formed and placed on the adhesive layer 13h, the conductive structures 13p can be formed by any suitable processes. Hence, the conductive structures 13p may have any shape or length depending on different design requirements. For example, a top view (or a bottom view) of the conductive structures 13p may have a shape of circle, triangle, rectangle, polygon or any other shapes. This can increase the flexibility for designing the interconnection structure 13.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 µm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
   a substrate;
   an interconnection structure disposed on the substrate, the interconnection structure having a conductive structure and a first dielectric layer covering a portion of the conductive structure, the conductive structure defining an antenna feeding point; and
   a package body disposed on the substrate and covering the interconnection structure,
   wherein the first dielectric layer has a first surface facing away from the substrate, a second surface opposite to the first surface, and a lateral surface extending between the first surface and the second surface of the first dielectric layer,
   wherein the package body is in contact with the second surface and the lateral surface of the first dielectric layer, and
   wherein a roughness of the first surface of the first dielectric layer is different from a roughness of the second surface of the first dielectric layer.

2. The semiconductor device package of claim 1, wherein the first surface of the first dielectric layer is substantially coplanar with a top surface of the package body.

3. The semiconductor device package of claim 1, wherein the conductive structure has a first surface substantially coplanar with the first surface of the first dielectric layer and a second surface substantially coplanar with the second surface of the first dielectric layer.

4. The semiconductor device package of claim 1, further comprising a soldering layer disposed between the substrate and the interconnection structure and electrically connecting the interconnection structure to the substrate, wherein the package body covers at least a portion of the soldering layer.

5. The semiconductor device package of claim 1, further comprising an antenna layer disposed over the interconnection structure and electrically connected to the conductive structure.

6. The semiconductor device package of claim 1, wherein a ratio of a height of the conductive structure to a diameter of the conductive structure is higher than 6:1.

7. A semiconductor device package, comprising:
   a substrate;
   an interconnection structure disposed on the substrate, the interconnection structure having a conductive structure and a first dielectric layer, the conductive structure defining an antenna feeding point, the first dielectric layer covering a lateral surface of the conductive structure and exposing a first surface of the conductive structure facing away from the substrate; and an antenna layer disposed on the interconnection structure and electrically connected to the conductive structure,
wherein a roughness of the first surface of the conductive structure is different from a roughness of a second surface of the conductive structure.

8. The semiconductor device package of claim 7, further comprising a first package body disposed on the substrate and covering a first lateral surface of the interconnection structure.

9. The semiconductor device package of claim 8, wherein
the first dielectric layer has a first surface facing away from the substrate, a second surface opposite to the first surface, and a lateral surface extending between the first surface and the second surface of the first dielectric layer; and
the first package body is in contact with the second surface and the lateral surface of the first dielectric layer.

10. The semiconductor device package of claim 9, wherein the first surface of the first dielectric layer is substantially coplanar with a top surface of the first package body.

11. The semiconductor device package of claim 8, further comprising a soldering layer disposed between the substrate and the interconnection structure and electrically connecting the interconnection structure to the substrate, wherein the first package body covers at least a portion of the soldering layer.

12. The semiconductor device package of claim 8, wherein a dielectric constant (Dk) of the first package body is different from a Dk of the first dielectric layer of the interconnection structure.

13. The semiconductor device package of claim 8, wherein the first package body further covers a second lateral surface of the interconnection structure, the second lateral surface being opposite to the first lateral surface.

14. The semiconductor device package of claim 8, further comprising a second dielectric layer covering the antenna layer and in contact with a portion of the conductive structure and a portion of the first dielectric layer.

15. The semiconductor device package of claim 14, wherein the second dielectric layer is further in contact with the first package body.

16. The semiconductor device package of claim 15, wherein a bottom surface of the second dielectric layer, a top surface of the first dielectric layer, and a top surface of the first package body are substantially coplanar.

* * * * *